(12) United States Patent
Wang et al.

(10) Patent No.: US 8,671,367 B2
(45) Date of Patent: Mar. 11, 2014

(54) INTEGRATED CIRCUIT DESIGN IN OPTICAL SHRINK TECHNOLOGY NODE

(75) Inventors: Chung-Hsing Wang, Hsinchu County (TW); Lee-Chung Lu, Taipei (TW); Yung-Chin Hou, Taipei (TW); Lie-Szu Juang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 721 days.

(21) Appl. No.: 12/340,294

(22) Filed: Dec. 19, 2008

(65) Prior Publication Data

US 2009/0326873 A1 Dec. 31, 2009

Related U.S. Application Data

(60) Provisional application No. 61/075,512, filed on Jun. 25, 2008.

(51) Int. Cl.
*G06F 17/50* (2006.01)
(52) U.S. Cl.
USPC .................. 716/55; 716/50; 716/51; 716/54
(58) Field of Classification Search
None
See application file for complete search history.

(56) References Cited

U.S. PATENT DOCUMENTS

| | | | | |
|---|---|---|---|---|
| 5,880,967 A * | 3/1999 | Jyu et al. | ........................ | 716/113 |
| 6,216,252 B1 * | 4/2001 | Dangelo et al. | ............... | 716/102 |
| 6,453,445 B1 * | 9/2002 | Kuhn et al. | ...................... | 716/55 |
| 7,191,425 B1 * | 3/2007 | Malik | ........................... | 716/112 |
| 7,640,520 B2 * | 12/2009 | Wang et al. | ..................... | 716/132 |
| 7,730,433 B2 * | 6/2010 | Hammouda et al. | .......... | 716/103 |
| 2007/0245183 A1 * | 10/2007 | Alam | ............................. | 714/724 |
| 2009/0326873 A1 * | 12/2009 | Wang et al. | ....................... | 703/1 |

FOREIGN PATENT DOCUMENTS

CN 101201852 6/2008

OTHER PUBLICATIONS

CN101201852A, SPICE Model Method for Proportional Contraction technique, Jun. 28, 2008, 6 pages; Machine Translation.*
Chinese Office Action (Notification of the First Examination Opinion), Dan Su, Examiner, State Intellectual Property Office of the People's Republic of China, 21 pages (Translation).*
S. Funaba et al., A Fast and Accurate Method of Redesigning Analog Subcircuits for Technology Scaling, Proceedings of the Asia and South Pacific Design Automation Conference, pp. 489-494, Feb. 1998.*
Chinese Patent Office, Office Action mailed Aug. 5, 2010, Application No. 200910150666.4, 5 pages.

* cited by examiner

*Primary Examiner* — Annette M. Thompson
(74) *Attorney, Agent, or Firm* — Haynes and Boone, LLP

(57) ABSTRACT

Disclosed is a system, method, and computer-readable medium for designing a circuit and/or IC chip to be provided using an optical shrink technology node. Initial design data may be provided in a first technology node and through the use of embedding scaling factors in one or more EDA tools of the design flow, a design (e.g., mask data) can be generated for the circuit in an optical shrink technology node. Examples of EDA tools in which embedded scaling factors may be provided are simulation models and extraction tools including LPE decks and RC extraction technology files.

16 Claims, 13 Drawing Sheets

INTEGRATED CIRCUIT DESIGN IN OPTICAL SHRINK TECHNOLOGY NODE

PRIORITY DATA

This application claims priority to Provisional Application Ser. No. 61/075,512, filed on Jun. 25, 2008 entitled "Integrated Circuit Design in Optical Shrink Technology Node," the entire disclosure of which is hereby incorporated by reference.

BACKGROUND

Optical (or lithographic) shrink processes of standard technology nodes, so called "half node" processes, are offered by semiconductor fabrication facilities (e.g., foundries). An optical shrink technology node ("half node") process may include a process having dimensions between technology nodes on the International Technology Roadmap for Semiconductors. Examples of typical optical shrink processes include 40, 55, 80, and 110 nanometer node processes, however any optical scaling factor may be possible. These exemplary optical shrink processes are optical shrinks of 45, 65, 90, and 130 nanometer standard technology node processes respectively. An optical shrink process includes any process that reduces the size of a circuit or chip without re-designing the circuit to fit into a smaller area. Thus, the provision of an optical shrink process allows designers to improve the performance and reduce the size of an integrated circuit. Costs can also be reduced, for example, by increasing the number of die available per wafer. Use of an optical shrink process also allows for quick realization of these design benefits using a design provided (e.g., drawn) by a standard (non-optical shrink) node as it does not require designing in a new node. In other words, a design for an integrated circuit (IC) in a standard node may be used to fabricate ICs in a smaller (shrink) technology node (e.g., a half node).

However, various actions may be required by a designer of an integrated circuit in order to ensure proper manufacturability and performance of a circuit that is to be fabricated using an optical shrink technology node. Therefore, what is desired is a design process and system that provides for decreased actions by a designer to provide a circuit in an optical shrink process.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
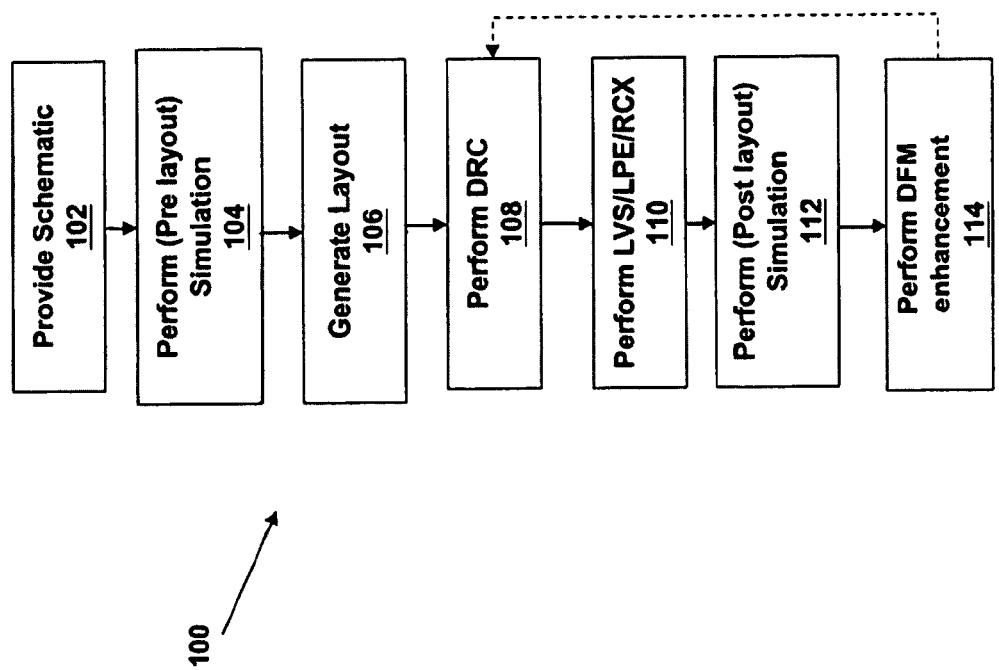
FIG. 1 is a flowchart illustrating one embodiment of a design flow for a circuit.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. It is understood that the figures provided, certain elements may be provided out of scale for the sake of clarity. Also, specific embodiments, or examples, are provided to better describe the more general inventive concepts. Many of the processes are known to one of skill in the art and are described in general detail only. Furthermore, the design methodologies described herein are exemplary only and may include additional, fewer, and/or different tools and/or steps than described herein. The described methodologies may be provided in one or more design tools (electronic design analysis or EDA tools) or computer readable medium devices and used by a circuit designer including, for example, an IC designer at a fabless IC design house, by a circuit designer at a semiconductor foundry, and/or other possible users. The EDA tools (and their input/outputs) described herein are provided using terms known to one skilled in the art (e.g., Liberty, SPICE, Verilog, Hercules, etc); one skilled in the art would also recognize other embodiments of the tools provided, for example, by other vendors. EDA tools include tools (e.g., simulation tools) used in different phases of the design process of an integrated circuit such as, SPICE simulation, LPE, RC extraction for implementation (place and route) or sign-off (final approval before tape-out), electro-migration and IR-drop analysis tools, power analysis tools, timing analysis tools, noise analysis tools, and/or other tools related to electrical or physical behavior of a design. Also, as described herein design data (e.g., data associated with a design) may be presented in various forms and formats for example, netlists, schematics, layout files, mask data (e.g., patterns to be used to form a photomask) and/or other representations of data describing a design of a circuit or chip, or portion thereof.

Referring to FIG. 1, the method 100 illustrates an embodiment of designing a circuit. The method 100 may be used in conjunction with the method 400, illustrated below with reference to FIG. 4, which provides for chip level integration. The method 100 provides for the design and verification of a circuit drawn in a first technology node to be fabricated in a second technology node—the second technology node being an optical shrink (e.g., half node) of the first technology node. Included in the descriptions of one or more steps of the method 100 is a description of conventional methods of performing the step or portion thereof. These conventional methods are provided to further elucidate the systems and methods described herein including those described in FIGS. 6 and 7, and are not intended to be limiting in any manner. Furthermore, one or more of the descriptions of the method 100 (as well as other descriptions provided herein including, for example, the methods 600 and 700 of FIGS. 6 and 7 respectively) are described as providing a design in a first technology node of 45 nm (a standard technology node) and providing for the design to be verified for fabrication in an optical shrink of the first technology node—a 40 nm ("half node" or optical shrink of the 45 nm) technology node using a scaling factor of 0.9. These process nodes are exemplary only and any combination of technology nodes, optical shrink (half nodes) technology nodes, and/or scaling factors are possible and within the scope of the disclosure.

The method 100 begins at step 102 where a schematic is provided. The schematic may be generated from a design specification and define a circuit to be fabricated on a substrate. The schematic may be provided as (e.g., translated to) a netlist (e.g., SPICE netlist). The netlist may be generated using a process design kit (PDK) including a process specific library. The PDK may include process models and design kits in appropriate technology file formats for use by a circuit designer. In a conventional design flow an IC manufacturer (e.g., a foundry supplier) may provide a PDK associated with a half-node process (e.g., a shrink of a 45 nm process). In the embodiment, a SPICE netlist generated in step 102 is associated with the half-node process.

The method 100 then proceeds to step 104 where a simulation may be performed on the netlist. The simulation may include a statistical design model such as SPICE (Simulation Program with Integrated Circuit Emphasis) model. SPICE is a circuit-analysis program developed by UC Berkeley. SPICE may provide a complete physical simulation including output signal deformation, signal level, and time delay. Other simulation tools may be possible in addition too, or in lieu of SPICE (including various commercial variations of SPICE). The simulation may determine if the provided netlist meets the specification. The simulation (e.g., SPICE model) will include geometric parameters in the half-node process (e.g., 40 nm).

In a conventional process flow a circuit designer may provide a netlist to be simulated in step 104. The netlist environment provided will need to include a scaling factor (e.g., 0.9) for the simulation to accurately account for the optical shrink of the process. A user (e.g., a circuit designer) is required to explicitly and manually set the scaling factor (e.g., by an affirmative action, for example, selecting an option on software program or through manipulation of data). An example variable to be set includes ".option scale" parameter of a simulation tool.

The method 100 then continues to step 106 where a custom or semi-custom layout is performed. A layout may be generated as a GDS file (e.g., GDSII file), though other formats are possible. In the step 106 in a conventional embodiment, the netlist is used to provide a layout file in the optical shrink technology node dimension, that is, a layout associated with the 40 nm process. The layout is generated using a PDK of the optical shrink technology node.

The method 100 then proceeds to step 108 where the physical verification processes begin, and in particular where a design rule check (DRC) is ran. The DRC may determine if there is a violation of the design rules associated with a given process. In an embodiment, a DRC deck associated with the optical shrink process (e.g., 40 nm) is used.

The method 100 then proceeds to step 110 where additional verification processes occur. In an embodiment, a layout-versus-schematic (LVS) (e.g, layout versus schematic comparison), a layout parasitic extraction (LPE) (e.g., a layout parameter extraction for MOS, resistor, capacitors, inductors, and/or other semiconductor devices), and/or a resistance and capacitance extraction (RCX) (e.g., interconnect parasitic resistance and capacitance extractions for timing simulations) are performed, however, other verification steps may be possible. The step 110 uses the layout and the netlist (e.g., SPICE netlist) to perform one or more of the verification steps. The step 110 determines if a layout and schematic are matched. Step 110 also generates an LPE netlist associated with the optical shrink process technology node and parasitic parameters (e.g., wire parasitics) associated with the optical shrink technology node.

In a conventional embodiment, a circuit manufacturer (e.g., foundry) may provide an LVS deck and/or RCX technology file associated with the optical shrink technology node (e.g., 40 nm) for use in the verification. A user (e.g., circuit designer) is required to manually set a scaling factor (e.g., by an affirmative action, for example, selecting an option on software program or manipulation of data) in one or more of the LVS, LPE, and/or RCX tools.

The following table illustrates an embodiment of scaling factors provided in the LVS or extraction tools. Numerous other embodiments are possible, for example, as determined by various other EDA tools.

|  | LVS Tools | | |
|---|---|---|---|
|  | Hercules | Calibre | Assura LVS |
|  |  | RCX Tools | |
|  | Star-RCXT | Calibre-xRC | Assura RCX |
| Interconnect scaling | (In Star-RCXT command file) magnification_factor: 0.9 magnify_device_params: NO (For cross-reference in output netlist) XREF: YES | (In Calibre-xRC run script) setenv PEX_FMT_NO_MAGNIFY ON (In xRC rule file) PEX MAGNIFY 0.9 | capgen-c-scale 0.9 To generate a N45GS deck |

The method 100 then proceeds to step 112 where a post-layout simulation is performed. The post-layout simulation may be performed using a SPICE simulation model substantially similar to as described above with reference to step 104. The simulation may be performed on a layout including dimensions of the optical shrink technology node. The simulation can determine whether the layout of the circuit meets the specification. The input to the simulation model may include an LPE netlist (SPICE netlist).

In a conventional embodiment, a user (e.g., circuit designer) is required to include a scaling factor in the LPE netlist environment to provide for accurate simulation of the design data in the optical shrink process. The user is required to manually set the scaling factor (e.g., by an affirmative action, for example, selecting an option on software program or manipulation of data). An example variable to be set includes ".option scale" inserted in the netlist.

The method 100 then proceeds to step 114 where a design for manufacturability (DFM) enhancement is performed. DFM may include analysis of neighboring devices in a layout which will effect electrical behaviors of a device. A DFM enhancement includes those modifications to the circuit design to make it more manufacturable to, for example, increase yields, reliability, and/or quality of a circuit. The circuit manufacturer may provide a DFM enhancement utility associated with the optical shrink process. The DFM enhancement may include tools such as optical proximity correction (OPC) and other resolution enhancement techniques (RET) and other process simulations. The DFM enhancement techniques may account for manufacturing variations such as, stress between layers, poly feature rounding, well proximity, length of regions (e.g., OD) and determine the electrical and/or physical results of such process variations. In step 114, in a conventional embodiment, the layout in the optical shrink technology node is provided to the DFM enhancement utility. The DRM enhancement utility may provide for the final layout in the optical shrink dimension. In an embodiment of the method 100, one or more verification steps such as the DRC of step 108 and/or the LVS, LPE, and RCX of step 110 may be performed on this "final" layout.

Therefore, in a conventional embodiment of a design flow similar to the method 100, a scaling factor command is required to be asserted by a user (e.g., circuit designer) at various steps throughout the method 100. In particular, a scaling factor must be manually inserted into an EDA tool for example, into a simulation tool (e.g., model) for a pre-simulation such as described in step 102 and into a post-simulation as described in step 114, as well as inserted in LPE and/or RC extraction tools such as provided in step 110.

Figure 2:
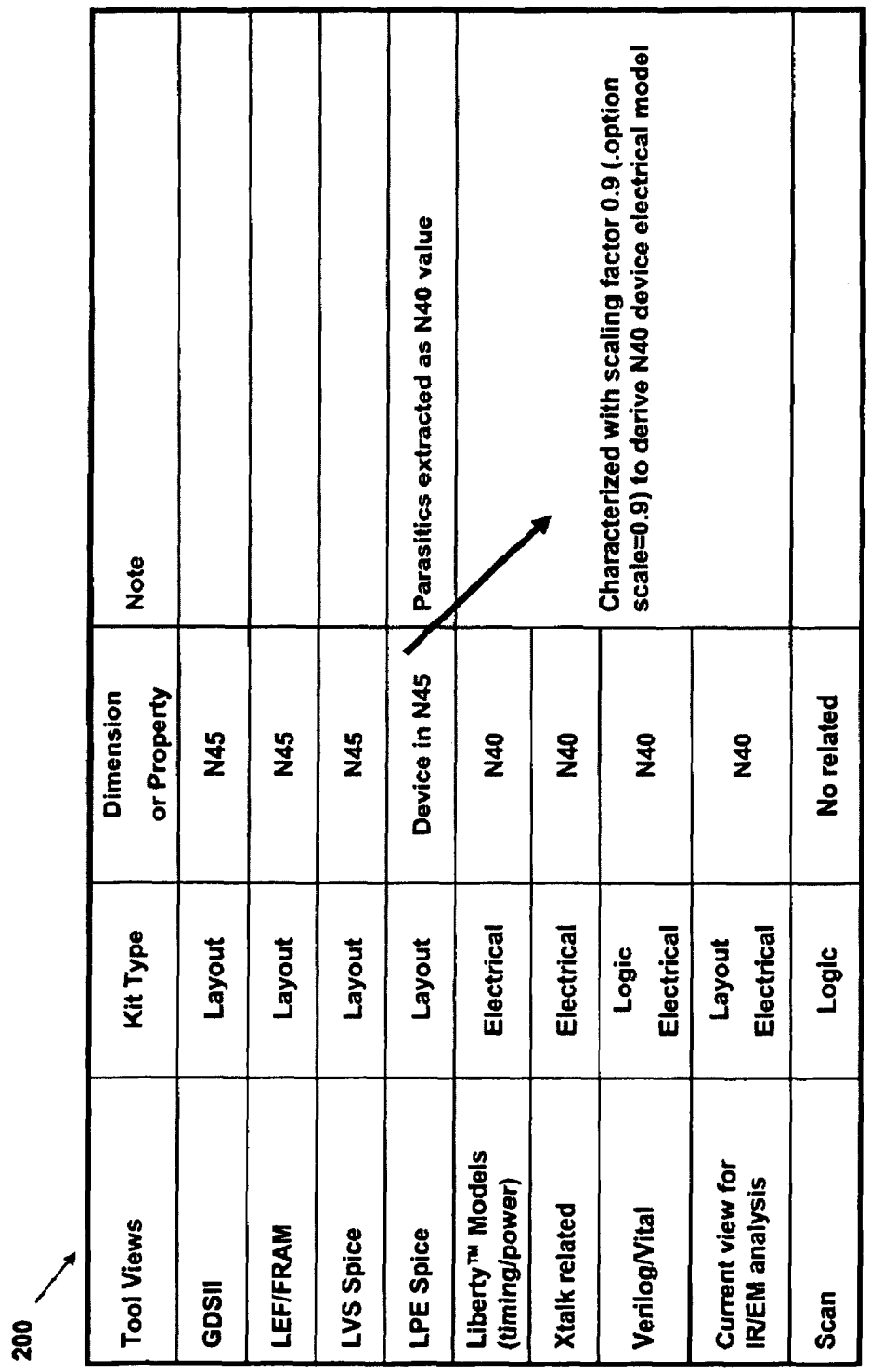
FIG. 2 is a table illustrating an embodiment of tools used in a circuit design process.

Referring now to FIG. 2, illustrated is table 200 illustrating a high level view of an embodiment of tools that may be used in circuit design, such as to perform the steps described above in the method 100. The table 200 illustrates the corresponding property (technology node) of the tools. Though illustrated as a 45 nanometer (N45) process and an associated optical shrink technology node of a 40 nanometer process (N40), the table may be illustrative of any process and corresponding optical shrink of the process. The table illustrates for example, layouts including the data format of library exchange format (LEF) and FRAM view for floor plan data and the mask pattern data as GDSII data format as tools associated with the 45 nanometer process. One skilled in the art would readily recognize the listing of tools is exemplary only and many tools in addition or in lieu of the listed tools may be provided.

Figure 3:
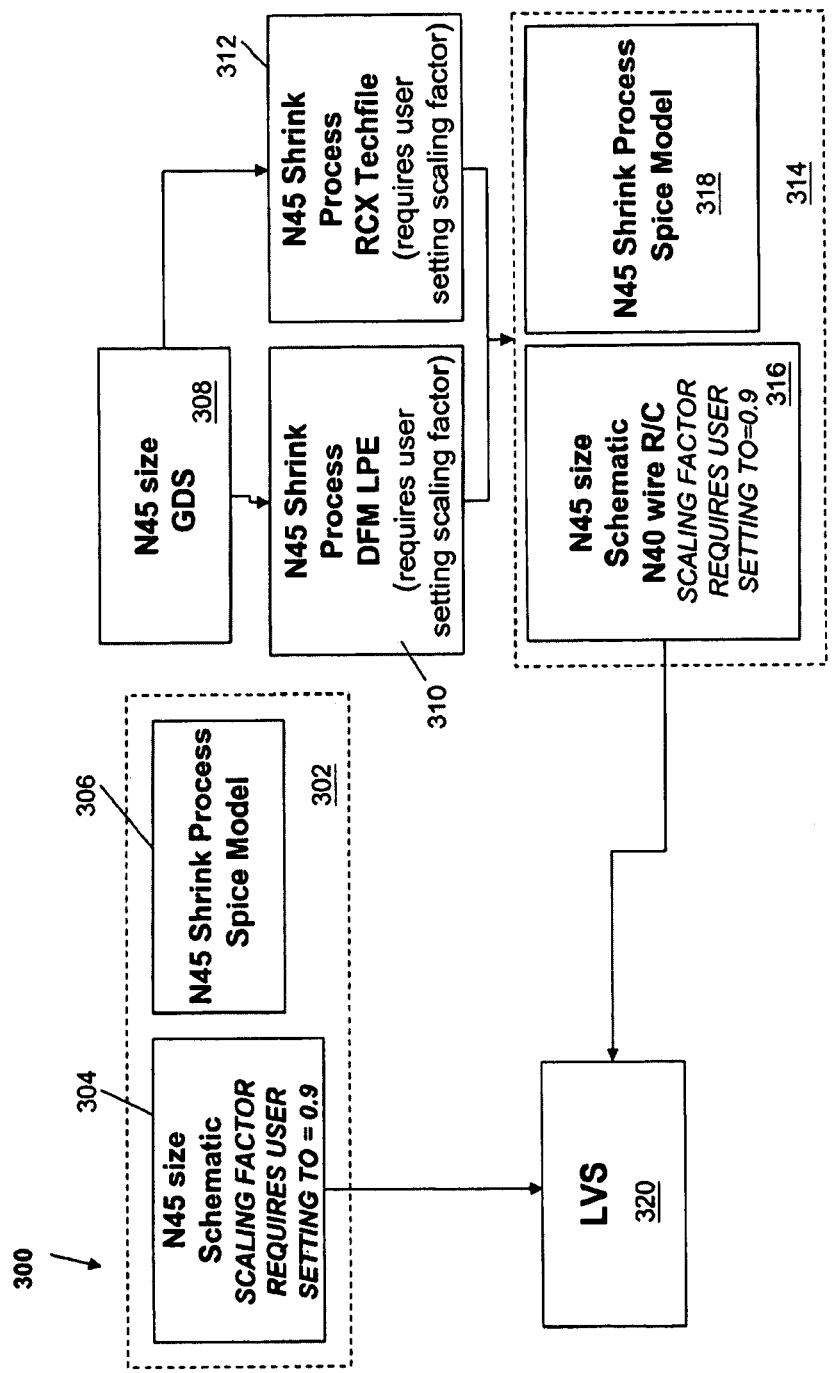
FIG. 3 is a block diagram illustrating an embodiment of a system for design of a circuit.

Referring now to FIG. 3, illustrated is a block diagram of a circuit design system 300 used to provide a design associated with an optical shrink process using conventional design tools and methodologies. A simulation system 302 provides a simulation such as described in the step 104, described above with reference to FIG. 1. The simulation system 302 includes a schematic 304 associated with the N45 process and a simulation model (SPICE model) 306 for the optical shrink process (N45 Shrink). The schematic 304 includes a netlist including a scale factor set to 0.9, the scale factor is manually provided by a designer such as described above. The schematic 304 is provided to an LVS tool 320.

The circuit design system 300 also includes the N45 sized GDS layout file 308. The GDS layout 308 is provided to DFM/LPE tools 310 associated with the N45 Shrink process (e.g., half node or optical shrink process of the 45 nanometer process). The operation of DFM/LPE tools 310 requires setting a scaling factor of 0.9 in the tool, for example, as described above with reference to step 110 and/or 114 of FIG. 1. In a conventional embodiment, the scaling factor is entered by a user of the system 300. The layout file 308 is also provided an extraction tool 312. The extraction tool 312 includes a RCX technology file. The technology file is associated with the N45 Shrink process. The extraction tool 312 requires a providing a scaling factor to the tool. In a conventional embodiment, the scaling factor is entered by a user of the system 300. The verification tools 310 and 312 provide an LPE netlist with a device drawn in an N45 dimension and N40 wire parasitics respectively. These are sent to the simulation block 314 where a post layout simulation is provided using the N45 size schematic with N40 wire RC 316 and an N45 Shrink process model (e.g., SPICE model for an optical shrink process) 318. The simulation block 314 requires a scaling factor. In a conventional embodiment, a user of the system 300 must affirmative set a scaling factor to account for the N45 size schematic. The LVS tool 320 may perform a verification of the N45 size schematic 304 and the N45 size schematic 316. Therefore, in an embodiment, the LVS tool 320 performs a verification of two files both associated with an N45 geometry.

Figure 4:
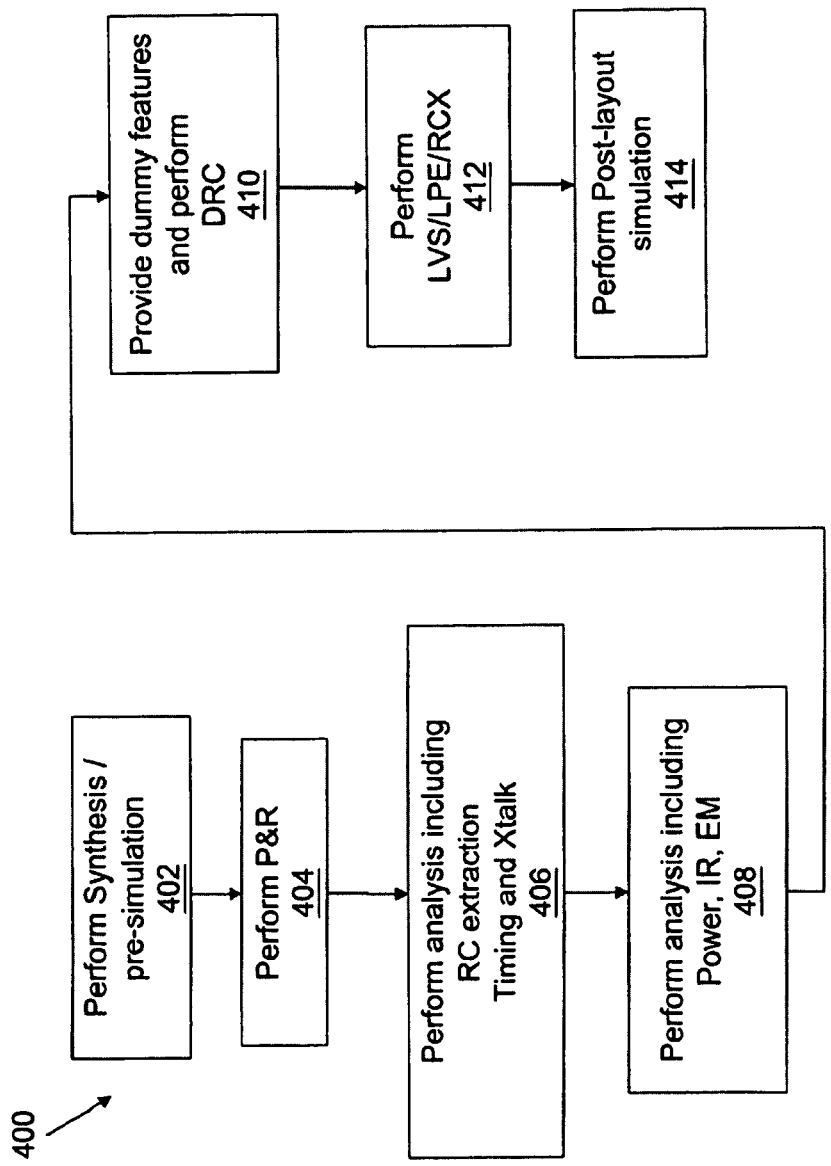
FIG. 4 is a flow chart illustrating an embodiment of a design flow for a chip (integrated circuit on a substrate).

Referring now to FIG. 4, illustrated is a flow chart of an embodiment of a method 400 for a chip design. The method 400 provides a general description the steps for design including chip level integration. The method 400 provides for the design and verification of a chip (e.g., integrated circuit) drawn in a first technology node, to be fabricated in a second technology node—the second technology node being an optical shrink (e.g., half node) of the first technology node. Included in the descriptions of one or more steps of the method 400 is a description of conventional methods of performing a step or portion thereof. These conventional methods are provided to further elucidate the systems and methods described herein and are not intended to be limiting in any manner. Furthermore, the method 400 is described as providing a design in a first technology node—45 nm technology node to be designed and verified for fabrication in an optical shrink of the first technology node—a 40 nm ("half node" or optical shrink of the 45 nm) technology node using a scaling factor of 0.9. These process nodes are exemplary only and any combination of technology nodes, optical shrink technology nodes (half nodes), and/or scaling factors is possible and within the scope of the disclosure.

The method 400 begins at step 402 where synthesis (e.g., RTL synthesis or logic synthesis) is performed. A specification is provided. In an embodiment the specification includes a register transfer level (RTL) of a circuit. The step 402 synthesis provides a gate level net list and a predicted post-layout timing result for an optical shrink process (e.g., 40 nm process). To produce the gate level net list and predicted timing result, a designer may use a standard technology node (non-optical shrink technology node, e.g., 45 nm) cell library including cells such as, I/O cells, SRAM cells, IP cells such as may be generated using the method 100, and/or other circuit components known in the art to be included in a cell library.

The method 400 then proceeds to step 404 where the gate level netlist provided by the step 402 is used to perform a place and route (P&R) procedure. The P&R generates a chip layout in the standard technology node (e.g., 45 nm dimension). To provide for the layout, the designer may use the cell library described above with reference to step 402, P&R technology files, optical shrink technology node timing and power technology files.

In a conventional embodiment, a library kit associated with a 45 nm dimension process and 40 nm electrical properties may be used to generate the P&R layout database. In a conventional embodiment, a P&R technology file including 45 nm routing rules and 40 nm RC technology files may be used to generate the P&R layout database. In a conventional embodiment, a user must affirmatively provide a P&R tool scaling parameter setting such that the appropriate interconnect scaling is provided (accounting for the optical shrink process). For example, a designer may enter a scaling factor of 0.9 to provide for the optical shrink from a 45 nm process to a 40 nm process.

Examples of scaling factors in a P&R tool are provided in the table below. Numerous other embodiments are possible, for example, as determined by various other EDA tools.

timing and crosstalk views associated with the optical shrink technology node.

In a conventional embodiment, to perform the RC extraction (RCX) of an interconnect or interconnect net, a user uses an RCX technology file for a shrink process and manually enters a scaling factor (e.g., 0.9) to appropriately scale the layout. In the conventional embodiment, a designer must affirmatively provide the scaling factor to account for the optical shrink process. For example, a designer may enter a scaling factor of 0.9 to provide for the optical shrink from a 45 nm process to a 40 nm process.

Examples of scaling factors in an RCX tool are provided in the table below. Numerous other embodiments are possible, for example, as determined by various other EDA tools.

|  | RCX Tools | |
| --- | --- | --- |
|  | Star-RCXT | QRC |
| Input file | Milkyway database Or DEF file | DEF file |
| Layout scaling | (In Star-RCXT command file) magnification_factor: 0.9 | (In Fire&Ice command file) extraction_setup – layout_scale 0.9 |
|  | Xtalk library | |
| preparation | AstroXtalk | Celtic |
| Input file Layout scaling | LPE spice .option scale = 0.9 | LPE spice .option scale = 0.9 |

The method 400 then proceeds to step 408 where further analysis is performed on the chip layout to determine the power, IR (e.g., voltage drop), and electromigration (EM) characterization of the chip layout as associated with an optical shrink technology node. For example, a chip layout in a 45 nm dimension is provided and power, IR, and EM results are generated. The results may be generated using a library with

|  | P&R Tool | | |
| --- | --- | --- | --- |
|  | SOC Encounter | Astro | Physical Compiler/IC Compiler |
| Interconnect scaling | setShrinkFactor 0.9 | atTimingSetup atTimingSetupGoto "Parasitics" atCmdSetField "Parasitic Model Geometry Scaling" "0.9" atCmdSetParaModel | set_extraction_option max_process_scale 0.9\ min_process_scale 0.9 |

The method 400 then proceeds to step 406 where RC extraction, timing, and/or cross-talk (xtalk) analysis is performed on the chip layout provided in step 404 (e.g., the chip layout in the 45 nm dimension). In particular, the P&R layout database in the full technology node (45 nm) is provided. The tools generate a STA timing and cross talk result associated with the half node technology node (40 nm). The results may be generated using an RC technology file associated with the optical shrink technology node, and library kits including timing and power grid views, RC technology files, and EM rules each associated with an optical shrink process. The results generated may include chip power analysis result associated with the optical shrink technology node and/or chip IR/EM analysis result associated with the optical shrink technology node layout environment.

In a conventional embodiment, to determine the IR/EM and/or power analysis of a chip in the optical scale technology node dimensions, a user must affirmatively (manually) enter a scaling factor (e.g., 0.9) into the IR/EM tools and/or the design data (e.g., layout) to be analyzed by the tools. For example, a designer may enter a scaling factor of 0.9 to provide for the optical shrink from a 45 nm process to a 40 nm process.

Examples of scaling factors in an IR/EM tool are provided in the tables below. Numerous other embodiments are possible, for example, as determined by various other EDA tools.

| | IR/EM Tools | | |
|---|---|---|---|
| | Prime Rail | Voltage Storm | Apache |
| Input files | Milkyway database Or DEF file | DEF file | LEF files DEF file |
| Layout scaling for chip analysis | | In Vstorm command file layout_scale 0.9 | (In GSR file) LEF_SCALE_FACTOR 0.9 { leffile1 leffile2} DEF_SCALE_FACTOR 0.9 {deffile} Power pin/pad location file coordinates moved by users themselves |
| Library preparation | | In XTC command file setvar process_scale_factor 0.9 | (In APL config file) either SIZE_SCALE 0.9 or OPTION SCALE = 0.9 |

The method 400 then proceeds to step 410 where dummy features are placed in the layout and/or a design rule check (DRC) is performed. The dummy features may include dummy poly features (DPO), dummy features in the active region (DOD), dummy metal features (DM), and/or other dummy pattern types known in the art. The dummy feature utility used to provide the dummy feature pattern may be associated with an optical shrink process. A DRC may be performed using a DRC deck associated with the optical shrink process. The step 410 generates a chip layout in the standard technology node (e.g., 45 nm) including dummy features and a DRC result.

The method 400 then proceeds to step 412 where verification procedures are performed including LVS, and parameters are extracted including by LPE and RCX tools. The layout is provided and compared to the netlist (SPICE netlist), both provided in the standard technology node (e.g., 45 nm). The LVS tool determines if the netlist and layout match. The extraction tools generate the parasitics associated with the design in the optical shrink technology node (e.g., 40 nm). The LVS deck may be associated with the optical shrink process. The RCX technology file may also be associated with the optical shrink process. A Standard Parasitic Exchange Format (SPEF) netlist with optical shrink (40 nm) parasitics is generated.

In a conventional embodiment, a designer manually provides a scaling factor (e.g., 0.9) to an RCX technology file for ensure proper extraction of the provided layout (e.g., 45 nm layout). This is described in greater detail above with reference to the step 110 of the method 100.

The method 400 then proceeds to step 414 where a post-layout simulation is performed. The SPEF gate level net list provided in step 412 and an SDF file associated with the 40 nm process is provided. The simulation provides for a timing parameter associated with the optical shrink process (e.g., 40 nm). A cell library, Verilog, and timing models may be used to perform the analysis.

In a conventional embodiment, the simulation requires a user to affirmatively enter a scaling factor to account for the optical shrink technology node. For example, a designer must enter a scaling factor of 0.9 to account for a shrink from the 45 nm to 40 nm process. This is described in greater detail with reference to the simulations of step 104 and/or 112 of the method 100.

Therefore, as described above with reference to FIGS. 1, 2, 3, and 4, in a conventional embodiment of designing a circuit and/or chip, a user needs to manually specify a scaling factor in one or more design steps to account for the translation to the optical shrink technology node process. Examples of design steps that may require manual specification of a shrink parameter are described above and include manual specification in using EDA tools for simulation (e.g., SPICE simulation pre and post layout), placement and routing (PR), RC extraction (RCX), crosstalk and timing analysis, IR and EM analysis and DFM. These requirements for manual assertion of the scaling factor increase the error risk for the design process. For example, a designer who neglects to accurately set the shrink parameter will incorrectly model his circuit and find troubleshooting the resultant error difficult. Therefore, a process that is less error prone and easier to control design quality for an optical shrink technology node (half node process) is desired. In addition, in the case where a circuit manufacturer is a foundry providing a service to a circuit designer (a fabless design house), a process requiring fewer considerations by the circuit designer improves customer service.

Figure 5:
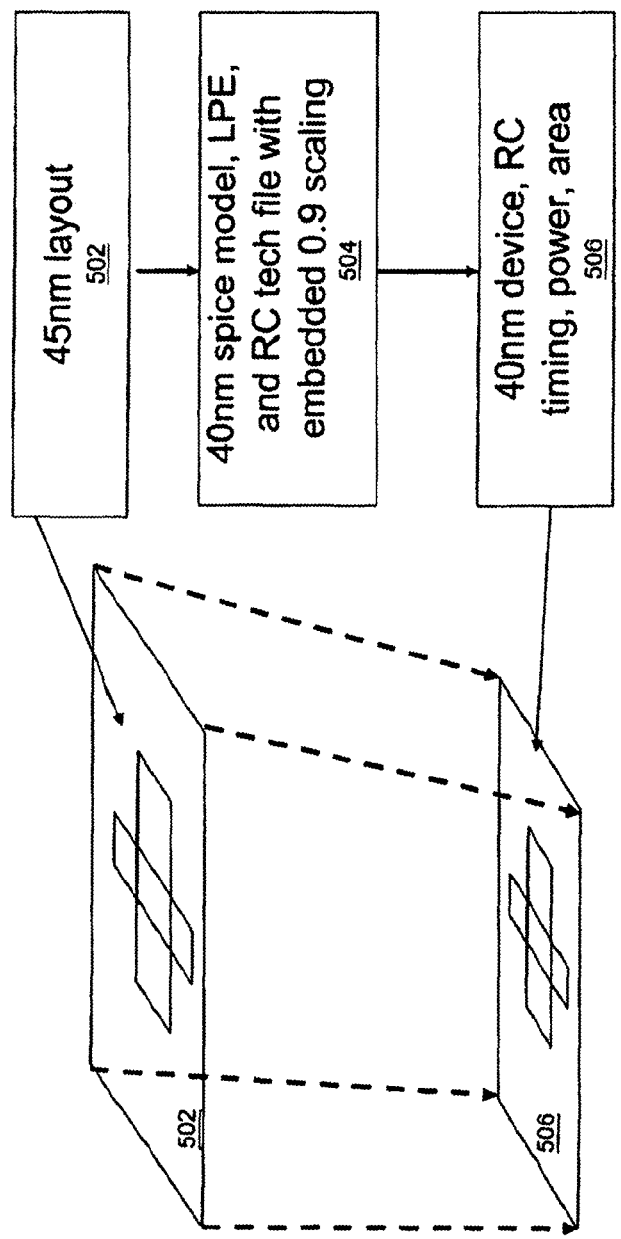
FIG. 5 is a schematic illustrating an embodiment of prepare design data in an optical shrink technology node.

Referring now to FIG. 5, illustrated is a schematic describing an optical shrink process. Design data, a layout 502, is provided in a first, standard, technology node, for example, 45 nm process. This design may be provided by a circuit designer (e.g., a fabless IC customer). Appropriate scaling is then provided by the EDA tools 504 (e.g., simulation (SPICE) model, LPE and RC technology files). In an embodiment, the scaling is provided using an embedded scaling factor as described in further detail below. In the illustrated embodiment, a scaling factor of 0.9 is embedded to provide an optical scaling (e.g., translation) from 45 nm layout to a 40 nm device 506, though any possible combination of technology nodes and scaling factors may be possible. This optical scaling provides a device or design data (e.g., mask pattern data) 506 in an optical shrink technology node (e.g., 40 nm). For example, in the illustrated embodiment, provided is a 40 nm device 406 including RC, timing, power and area all associated with the 40 nm technology node. In other words, design data associated with a 45 nm design rule can be translated to design data associated with a 40 nm technology node, for example, translated to a mask database in a 40 nm technology node. This translation may occur transparently to a user (e.g., circuit designer). This translation or optical shrink results in a die size reduction. In the illustrated embodiment, the scaling factor results in an approximately 20% die size reduction.

Figure 6:
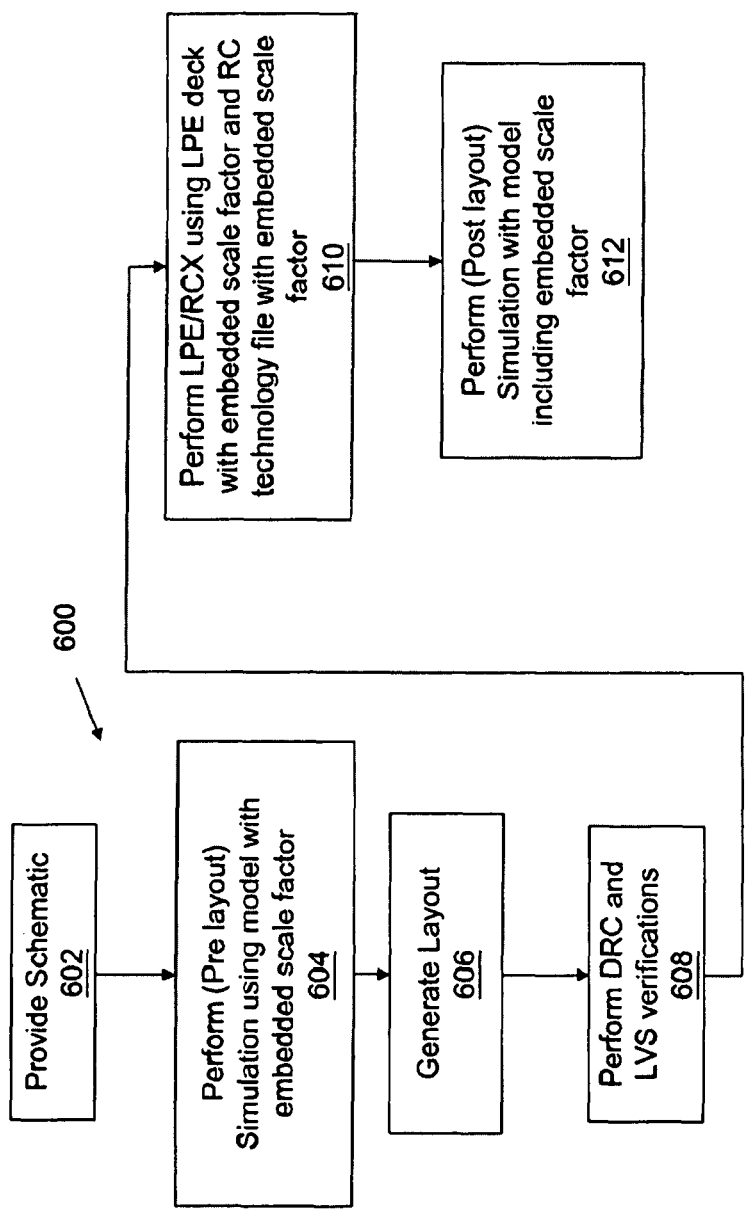
FIG. 6 is a flow chart illustrating an embodiment of a transparent design flow for a circuit in an optical shrink technology node.

Referring now to FIG. 6, illustrated is a method 600 including a circuit design flow. The method 600 may be substantially similar to the method 100 described above, except for modifications addressed herein. The method 600 may be used to provide a design for a circuit that is originally designed in a standard technology node but is to be fabricated using an optical shrink process of the standard technology node, thus providing for the translation of design data from one technology node to an optical shrink technology node. The method 600 is described in further detail using an embodiment providing for a standard technology node of 45 nanometers (N45) and an optical shrink technology node of 40 nanometers (N40). However, any combination of technology nodes and scaling factors may be possible and within the scope of this disclosure in general, and the method 600 in particular.

The method 600 begins at step 602 which is substantially similar to the step 102, described above with reference to FIG. 1. The method 600 may be used to provide a design for a circuit that is designed in a standard (non-half-node) technology node and is to be fabricated using an optical shrink technology node process (half-node) of the standard technology node. A schematic of a circuit in a standard technology node may be provided. In an embodiment, a schematic in a 45 nanometer technology node is provided. The method 600 then proceeds to step 604 where a simulation of a netlist of the circuit is performed. A simulation model, for example, a SPICE model, may be used to perform the simulation. The simulation model includes an embedded scaling factor. In an embodiment, a scaling factor is embedded in a SPICE model. In an embodiment, the simulation model includes an embedded scaling factor of 0.9 to adjust for the netlist of the circuit being associated with an 45 nm technology node in comparison with an optical shrink technology node process in which the circuit is to be formed—a 40 nm process. An embedded scaling factor includes providing a factor in a tool, such as a model. In an embodiment, an embedded scaling factor requires no affirmative action by a user of the system in which it is embedded. A scaling factor may be embedded (e.g., incorporated into) a model by a circuit manufacture (e.g., foundry) that then supplies the tool including the embedded factors to a circuit designer for use.

The method 600 then proceeds to step 606 where a layout is generated. The layout may be associated with the circuit in the standard technology node. In an embodiment, the layout is provided in the 45 nm dimension. In an embodiment, the layout is a GDSII file.

The method 600 then proceeds to step 608 where a DRC and/or LVS verification is performed on the design data. The DRC tool may determine a design rule violation for the layout of the circuit. The layout may be provided in a standard technology node (e.g., 45 nm). The DRC tool may include decks associated with the standard technology node and/or the optical shrink technology node, or the same deck may be used for both processes. The LVS tool determines if design data is matching (a layout and schematic). The layout and the schematic may both include the standard technology node (e.g., 45 nm) dimensions.

The method 600 then proceeds to step 610 where a layout parameter extraction (LPE) and/or resistance capacitance extraction is performed (RCX). The LPE is performed on a layout in the standard technology node (e.g., 45 nm). The LPE tool includes an LPE deck having an embedded scaling factor. In an embodiment, the embedded scaling factor is 0.9. The embedded scaling factor of 0.9 may account for the optical shrink (e.g., a 45 nm technology node translated to an optical shrink technology node of 40 nm). Similarly to as described above, an embedded scaling factor may be provided such that it is transparent to and requires no action on the part of, the user of the tool. The RCX is performed using a technology file (e.g., Signoff RC technology file) including an embedded scaling factor. In an embodiment, the embedded scaling factor is 0.9. The embedded scaling factor of 0.9 may account for the optical shrink (e.g., a 45 nm technology node to optical shrink technology node of 40 nm). A scaling factor may be embedded (e.g., incorporated into) a technology file and/or LPE deck by a circuit manufacture (e.g., foundry) that then supplies the tools including the embedded factors to a circuit designer for use.

The method 600 then proceeds to step 612 where a post layout simulation is performed. The post layout simulation may be performed on a layout in standard technology node (e.g., 45 nm). The simulation may be performed by a simulation model including an embedded scaling factor. In an embodiment, the simulation model is a SPICE model. In an embodiment, a scaling factor of 0.9 is embedded in the SPICE model to account for the optical shrink of the standard 45 nm technology node to an optical shrink process of 40 nm.

Thus, the method 600 provides for a transparent circuit design flow by embedding one or more scaling factors in one or more EDA tools. The transparent flow provides a process where the user (e.g., designer) is not obligated to affirmative enter a scaling factor to account the optical shrink technology node. Thus, a user can provide a design in a standard technology node, and achieve appropriate simulation, device parameters including parametrics, and verification of the design in an optical shrink technology node. The method 600 provides for embedding a scaling factor in one or more EDA tools such as used for the simulation, LPE, and RC extraction processes.

Figure 7:
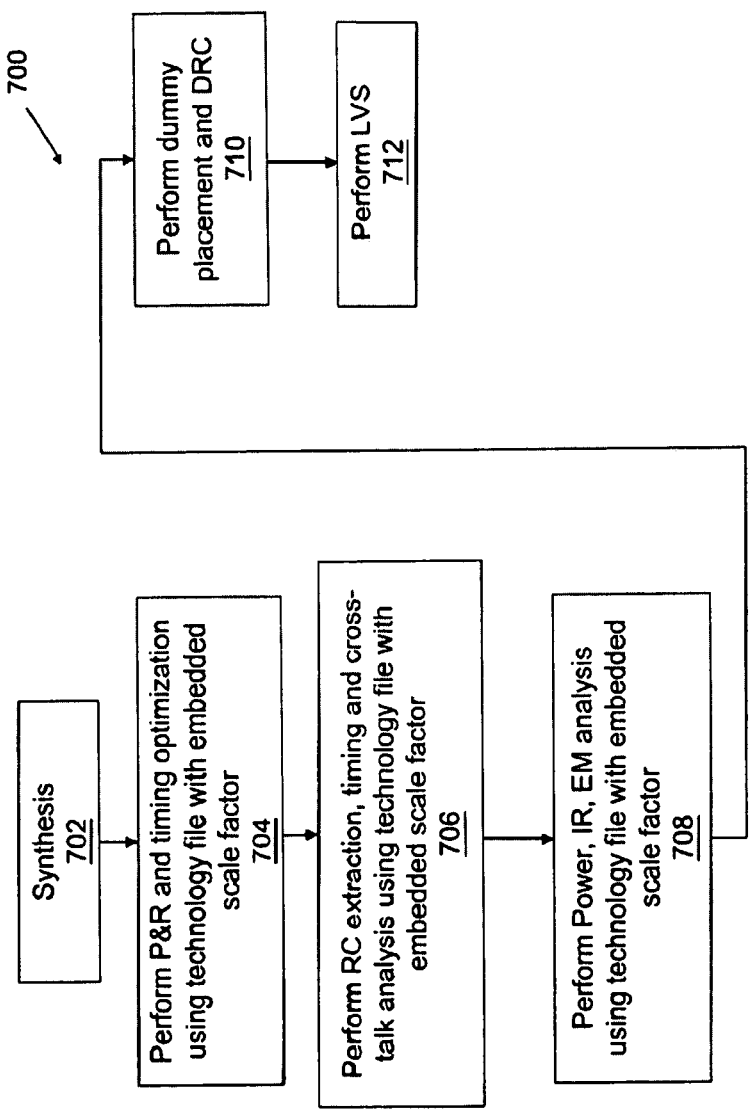
FIG. 7 illustrates a flow chart illustrating an embodiment of a transparent design flow for a chip in an optical shrink technology node.

Referring now to FIG. 7, illustrated is a method of chip (IC) design. The method 700 may be substantially similar to the method 400 described above, with modifications addressed herein. The method 700 may be used to provide a design for a chip that is originally designed in a standard technology node but is to be fabricated using an optical shrink process of the standard technology node. The method 700 is described in further detail using an embodiment providing for a standard technology node of 45 nanometers (N45) and an optical shrink technology node of 40 nanometers (N40). However, any combination of technology nodes and scaling factors may be possible and within the scope of this disclosure in general, and method 700 in particular.

The method 700 begins at step 702 which is substantially similar to the step 402, described above with reference to FIG. 4. A synthesis is performed on a design (RTL design) to provide a netlist associated with standard technology node. The library kits (e.g., front end libraries) used may be associated with a standard technology node. In an embodiment, the front end library kits may be in the 45 nm technology node. The time and power results may be provided and be results associated with an optical shrink technology node, e.g., the 40 nm technology node.

The method 700 then proceeds to step 704 where place and route (P&R) procedures are provided and timing is optimized. The back-end library kits used to perform the P&R may be associated with a standard technology node (e.g., 45 nm). The technology file (e.g., P&R RC tech file) used includes an embedded scaling factor. In an embodiment, the standard technology node is 45 nm and the optical shrink technology node is 40 nm and an embedded scaling factor of 0.9 is provided in the technology file.

Figure 8:
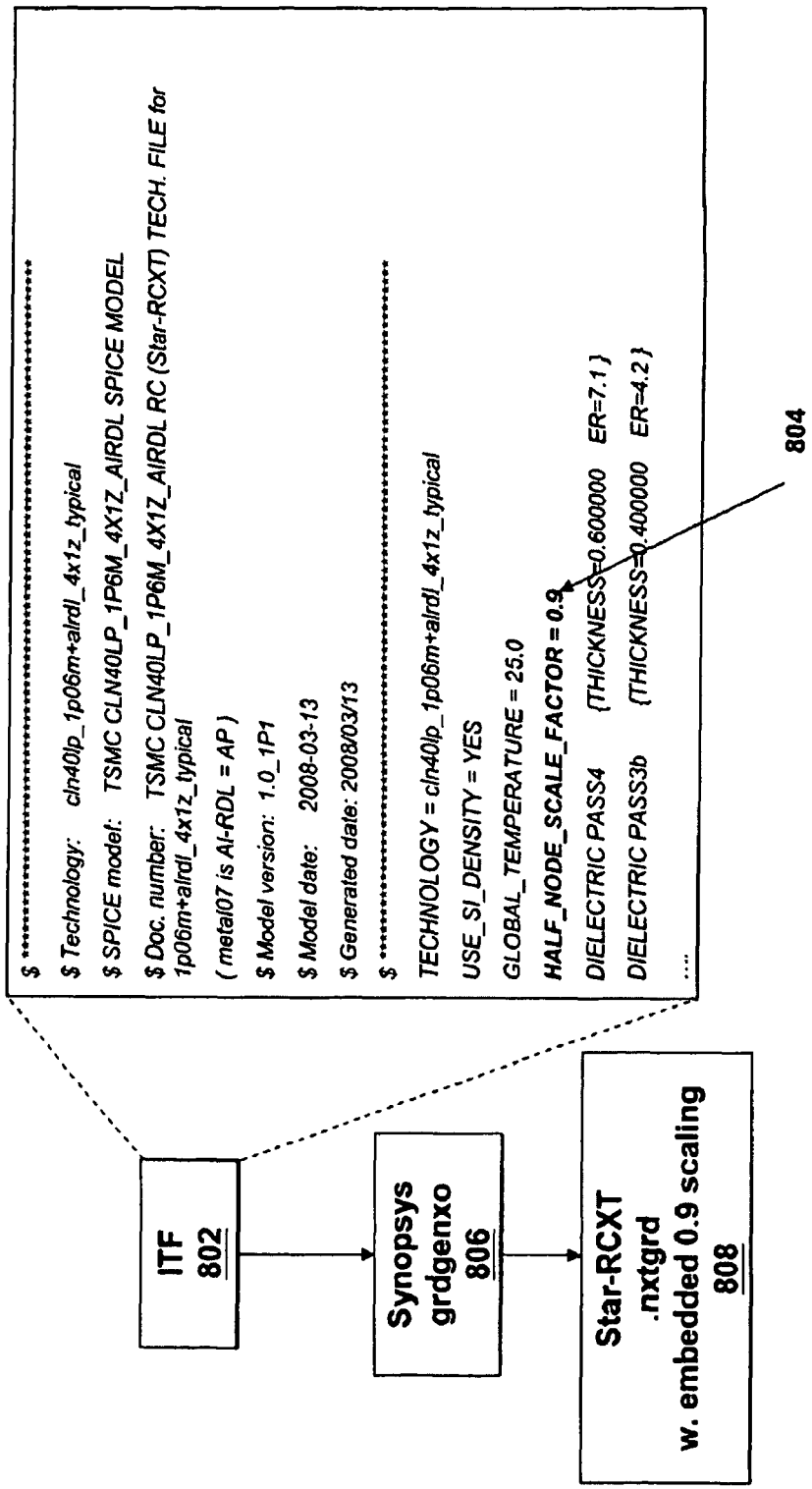
FIG. 8 illustrates an embodiment of a technology file including an embedded scaling factor.

The method 700 then proceeds to step 706 where RC extraction, timing analysis and/or signal integrity (SI) closure are performed. A technology file (e.g., RC tech file) with an embedded scaling factor may be used to perform the extraction. In an embodiment, the standard technology node is 45 nm and the optical shrink technology node is 40 nm and an embedded scaling factor of 0.9 is provided in the technology file. The timing library used may be associated with the optical shrink technology node. FIG. 8 illustrates an embodiment of an RC extraction technology file 802 with embedded scaling factor 804. The technology file 802 is provided to a field solver 806 which generates a RC table 808 based on the optical shrink technology node dimensions (e.g., a 40 nm process). The embodiment illustrates an embedded scaling factor of 0.9; however any scaling factor may be possible.

The method 700 then proceeds to step 708 where power, IR, and/or EM analysis and results are obtained. The results may be obtained using a technology file (e.g., a Signoff RC tech file) including an embedded scaling factor. In an embodiment, the standard technology node is 45 nm, the optical shrink technology node is 40 nm, and an embedded scaling factor of 0.9 is provided in the technology file. The power library used may be associated with the optical shrink technology node.

The method 700 then proceeds to step 710 where dummy placement and DRC verifications are performed. The step 710 may be substantially similar to the step 410 described above with reference to the method 400. The DRC deck for the optical shrink technology node may be the same as, or substantially similar to, the deck associated with a standard technology node.

The method 700 then proceeds to step 712 where an LVS verification is performed. The LVS may be performed on a layout and netlist both associated with the standard technology node. In an embodiment, the layout and netlist are associated with a 45 nm process. The LVS also may include an LPE deck with an embedded scaling factor, for example, 0.9 to account for the optical shrink technology node, for example, 40 nm.

In the description of the methods 600 and 700, exemplary embodiments are described using a 45 nanometer process, an optical shrink process of 40 nm, and an associated scaling factor of 0.9. However, any technology node, dimension, and/or scaling factor may be used. Furthermore, specific EDA tools are indicated as including embedded scaling factors, however one skilled in the art would recognize numerous other EDA tools that may benefit from embedded scaling factors.

In described methods, the designer does not require specific considerations for the optical shrink process in contrast to the manual assertion of a scaling factor as described above with reference to the conventional embodiments described in relation to one or more steps of the method 100 and 400 of FIGS. 1 and 4 respectively. Instead, EDA tools such as simulation model (SPICE model), LPE deck, and/or RC extraction technology files are provided (for example, to a designer) that have a scaling factor embedded into the tool (as well as a grow-back factor as appropriate). This may also provide for a design flow for an optical shrink technology node that is substantially similar to or the same as the design flow for a standard technology node process. For example, design data (e.g., netlist, layout) may be provided in a standard technology node and a design (e.g., mask data) may be generated in an optical shrink technology node transparently to a user of the system or method of design. Fewer errors including mistaken operations may be provided by the transparent embodiment as compared to the embodiment described above with reference to the method 100 where the user must input a scaling factor. This also provides an advantage of a half node design flow which is the same or substantially similar to a standard node design flow, from the perspective of the user (e.g., designer).

Figure 9:
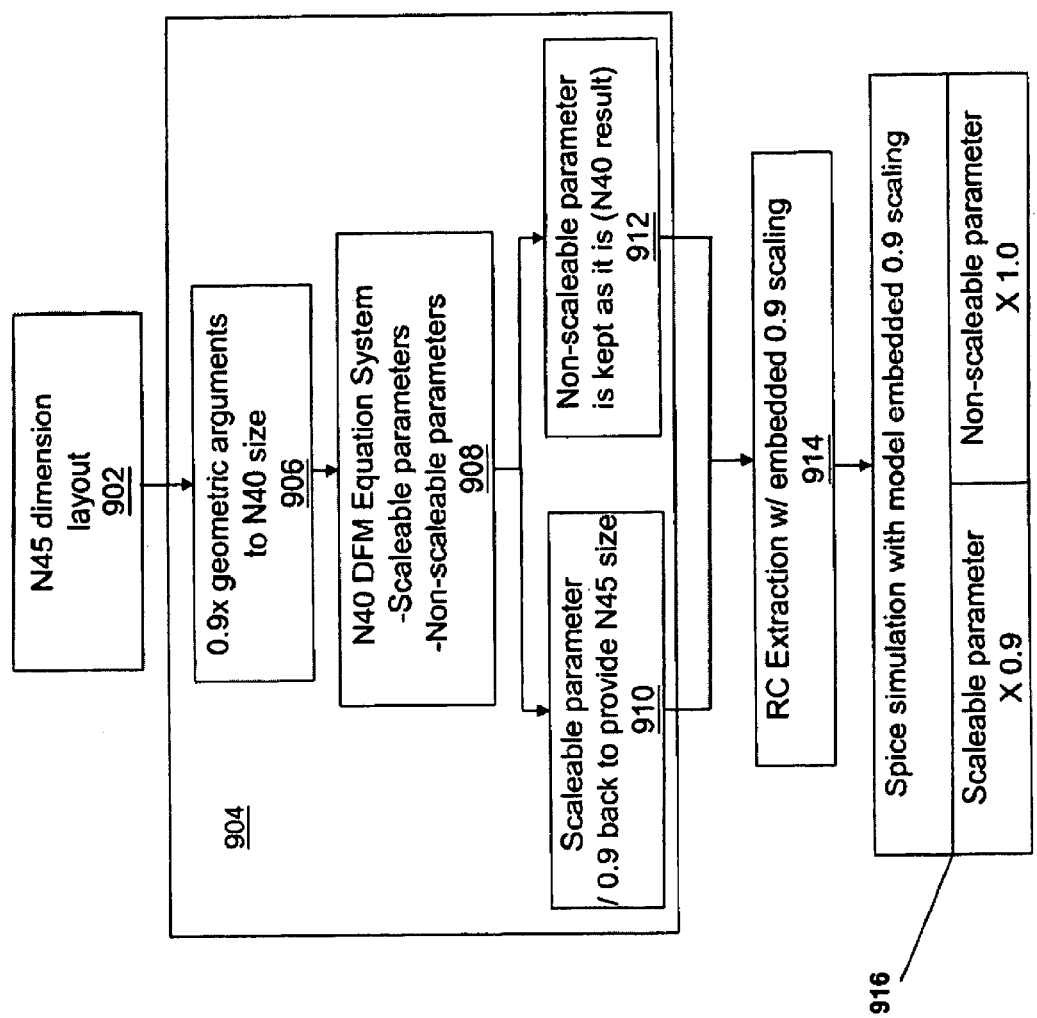
FIG. 9 illustrates a block diagram of an embodiment of a system for transparent design flow including DFM.

Referring now to FIG. 9, illustrated is a block diagram illustrating an embodiment of a design system 900 including LPE scaling methods for DFM effects. The design system 900 provides for a design in a first technology node to be translated to a second technology node and subsequently fabricated in the second technology node process, the second technology node an optical shrink of the first technology node. The embodiment is illustrated as providing a first, standard, technology node of 45 nanometers (N45) and a second, optical shrink technology node of 40 nanometers (N40) using a scaling factor of 0.9. However, any combination of technology nodes and scaling factors is possible. A layout 902 in the N45 dimension is provided. The layout 902 may include a GDSII file. The layout is provided to a "transparent" LPE deck 904. The LPE deck 904 is transparent in that, without action by a user, the deck will provide for appropriate scaling of the design for the optical shrink process technology. The LPE deck 904 includes subsystem 906 which extracts geometric arguments (parameters) of the 45 nm layout. Examples of geometric parameters include channel length, channel width, and other features of the layout including geometric dimensions. These parameters are multiplied by a scaling factor. In the illustrated embodiment, the scaling factor is 0.9. This translates the geometric parameters to dimensions of the optical shrink process (e.g., N40 size). The LPE deck 904 further includes a DFM equation system 908 which includes one or more DFM equations. One or more the equations may be associated with the optical shrink technology node (e.g., N40). The scaled geometric parameters generated by the subsystem 906 are provided to the DFM equation system 908 where they are determined to be scaleable or non-scaleable parameters. Scaleable parameters include those parameters of a geometric type. Geometric type parameters are those having dimension-dependent units, for example, microns, nanometers or other measurements of distance (e.g., length). Scaleable parameters include feature (e.g., channel) widths, feature (e.g., channel) lengths, poly spacing, and/or other parameters including geometric units. Examples of non-scaleable parameters include unit-less parameters, parameters with electrically quantified units (e.g., square resistance), and non-geometric units. Examples of non-scaleable parameters include those parameters that account for well proximity effects. DFM equations are then used on the parameters to account for process effects and variations such as well proximity, poly rounding, RET, stress of layers, and/or other process effects known in the art. The parameters may then restored as necessary to provide design data in the first technology node (e.g., 45 nm). In size-back subsystem 910, the geometric/scalable parameters previously scaled by a scaling factor in subsystem 906 are restored to the N45 size by dividing the parameter by the scaling factor −0.9. The non-scalable parameters are left unchanged (kept as the provided output from the DFM equation subsystem 908) by subsystem 912 as the results are representative of the both technology nodes—N40 result and the N45 result.

There are several advantages to the size-back subsystem 910. For example, the subsystem 910 provides for an output of the LPE 904 to be representative of the first technology node (e.g., N45), which may provide for an easier debugging process as a user is able to review the netlist in the dimensions in which the design originated. Furthermore, as described below with reference to FIG. 10, an output in the standard technology node allows portions of a design at different points in the design flow (e.g., pre and post simulation) to be consistent such that the portions of a design can be integrated and simulated together, despite differing in completeness.

The LPE netlist provided by the transparent LPE deck 904 is then provided to the RC extraction subsystem 914. The RC extraction subsystem 914 includes an embedded scaling factor. The embedded scaling factor may be substantially similar to as described above with reference to steps 610 and/or 706 of FIGS. 6 and 7 respectively and the RC extraction technology file 802 of FIG. 8. The RC extraction subsystem 914 may extract the resistance and capacitance parameters of the interconnects.

The LPE netlist in then provided to the simulation subsystem 916. The simulation subsystem 916 may include a SPICE simulation model. The simulation subsystem 916 includes a simulation model having an embedded scaling factor. In the illustrated embodiment, the embedded scaling factor is 0.9. The simulation subsystem using the embedded scaling factor to appropriately scale the scaleable parameters of the netlist, for example, by multiplying the scaleable parameters by a scaling factor of 0.9. In an embodiment, the non-scaleable parameters, already being representative of the optical shrink process are multiplied by a unitary scaling factor.

Figure 10:
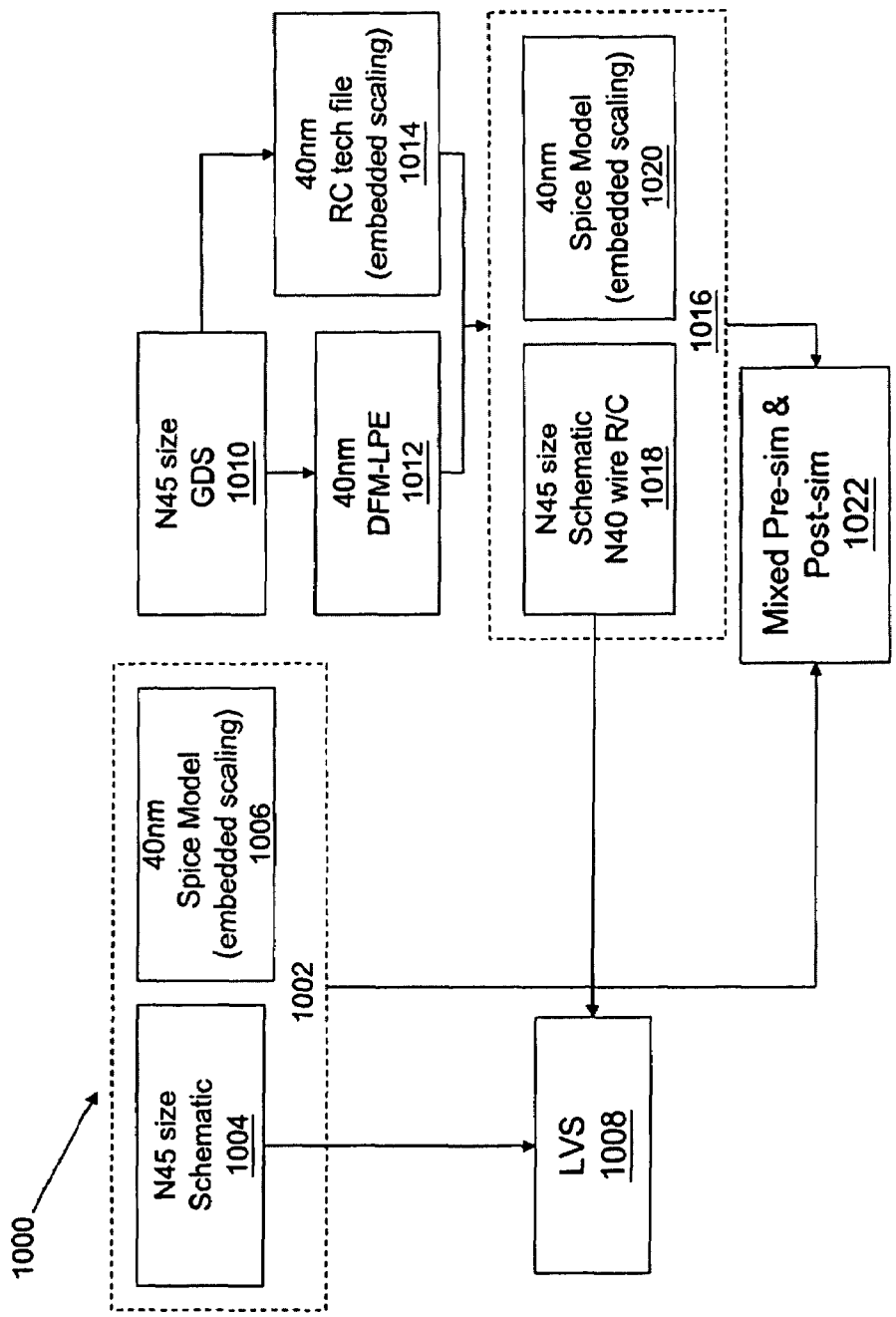
FIG. 10 illustrates a block diagram of an embodiment of a system for transparent design flow.

Therefore, the LPE scaling methods for DFM methods provided with reference to FIG. 10, instead of using geometry layout scaling (as described with the RC tools and simulation tools above, for example, with reference to FIGS. 5 and 7), the method uses geometric parameter scaling and provides these scaled parameters as inputs into DFM equations. The scaleable DFM equation output values are then restored back to the layout drawn size, and the non-scalable DFM output is kept as it is. This provides advantages as described above, and when a user (e.g., designer) runs an LPE with LVS net name and device name back-annotation (as in LVS tool 1008) (e.g., LPE output netlist could follow similar net name and device name as found in the schematic) since LVS is operating on a drawn size layout and drawn size schematics, when combining the LVS/LPE processes together, the LPE is operating on the same dimension as LVS. Furthermore, as described above, a user may find de-bugging easier as the LPE output netlist follows similar net name and device name as the original schematic.

In an alternative embodiment, the LPE tool could use geometry layout scaling method for DFM effects. In this embodiment, the benefits described above (e.g., debugging and LPE/LVS having the same dimension) may not be found, however, the simulation accuracy would still be realized.

Referring now to FIG. 10, illustrated is a block diagram of a circuit design system 1000 for providing a design in an optical shrink technology node. The circuit design system 1000 may similar to the system 300, described above with reference to FIG. 3, except as provided herein. The description of the circuit design system 1000 includes an embodiment providing for a design in a 45 nm technology node (N45) that is to be scaled (translated) to an optical shrink process of a 40 nm technology node (N40); however, any combination of technology nodes is possible. A simulation system 1002 provides a simulation such as described in step 604, described above with reference to FIG. 6. The simulation system 1002 includes a schematic 1004 in a standard technology node (e.g., N45 technology node) and a simulation model (SPICE model) 1006 associated with an optical shrink technology node (e.g., N40). The simulation model 1006 includes an embedded scaling factor to account for the geometric scaling between the 45 nanometer provided by the schematic 1004, and 40 nanometer process. The simulation system 1002 provides the schematic 1004 to the LVS tool 1008.

The circuit design system 1000 also includes a GDS layout file 1010 provided in the standard technology node dimensions (N45 sized). The layout 1010 is provided to a DFM/LPE tool 1012 associated with the optical shrink technology node (e.g., 40 nm technology node). The DFM/LPE tool 1012 includes a scaling factor (e.g., 0.9) embedded in the tool 1012, for example, as described above with reference to LPE 904 of FIG. 9. The layout 1010 is also provided to the RC extraction tool 1014. The RC extraction tool 1014 also includes an embedded scaling factor (e.g., 0.9), for example, as described above with reference to step 706 of FIG. 7 and/or the technology file 802 of FIG. 8. The output of the tools 1012/1014 (e.g., schematic and extracted parameters 1018) are provided to a post-simulation system 1016. The schematic 1018 is associated with the standard technology node—N45. The parasitics (e.g., R/C) are associated with the optical shrink technology node—N40. The post-simulation system 1016 performs a simulation of the schematic 1018 using a simulation model 1020. The simulation model 1020 includes an embedded scaling factor. The simulation model 1020 may be a SPICE model. In the illustrated embodiment, a 0.9 scaling factor may be embedded in the simulation model 1020 to account for the optical scaling (e.g., the dimensional differences between N45 and N40 processes). The output layout from the simulation model 1020 may be mixed with the output of the simulation model 1002. In an embodiment, the outputs of both models include layouts in the standard technology node—N45. Further simulations and/or analysis may be performed on the "mixed" design as provided by block 1022. The output of the simulation system 1016 is also provided to the LVS system 1008. The LVS system 1008 is operable to compare data from the simulation systems 1002 and 1016, the data both being from the same technology node—the standard technology node (N45). For example, the N45 schematic 1018 and N45 size schematic 1004 may be analyzed.

The scaling factors are described, throughout the disclosure, as being embedded in various EDA tools used for design of a circuit and/or chip. The EDA tools, in addition to as described above with reference to the methods 100 and 400, may include different embodiments. Embedded scaling factors may be include parameters embedded in a method, system, computer readable medium and/or software product such that the need for manual provision of the parameter or associated parameter is not required during use of the method, EDA tool, system, CRM, and/or software. Such embedded functionality allows the fabrication process node shrink to be "transparent" to an IC designer, which does not require additional effort and/or consideration by the user (e.g., designer). In an embodiment, a parameter is embedded in a tool by a IC manufacturer such as a foundry supplier, and the EDA tool is then provided to a user, such as a circuit designer, for use.

Therefore, provided is a method of embedding a scaling factor into an EDA tool such as an LPE technology file, RC technology file and/or simulation model (SPICE model) to make circuit design and chip integration for a optical shrink technology node, transparent to the user (e.g., designer). This allows the design flow for an optical shrink technology node to be the same or substantially similar as the provided by a standard technology node. The disclosure can be applicable to any EDA tool, standard technology node, and/or optical technology node including, but not limited to, the exemplary embodiments discussed.

The present disclosure can take the form of an entirely hardware embodiment, an entirely software embodiment, or an embodiment containing both hardware and software elements. In an illustrative embodiment, the disclosure is implemented in software, which includes but is not limited to firmware, resident software, microcode, etc.

Furthermore, embodiments of the present disclosure can take the form of one or more computer program products accessible from a tangible computer-usable or computer-readable medium providing program code for use by or in connection with a computer or any instruction execution system. For the purposes of this description, a tangible computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital video disc (DVD).

Figure 11:
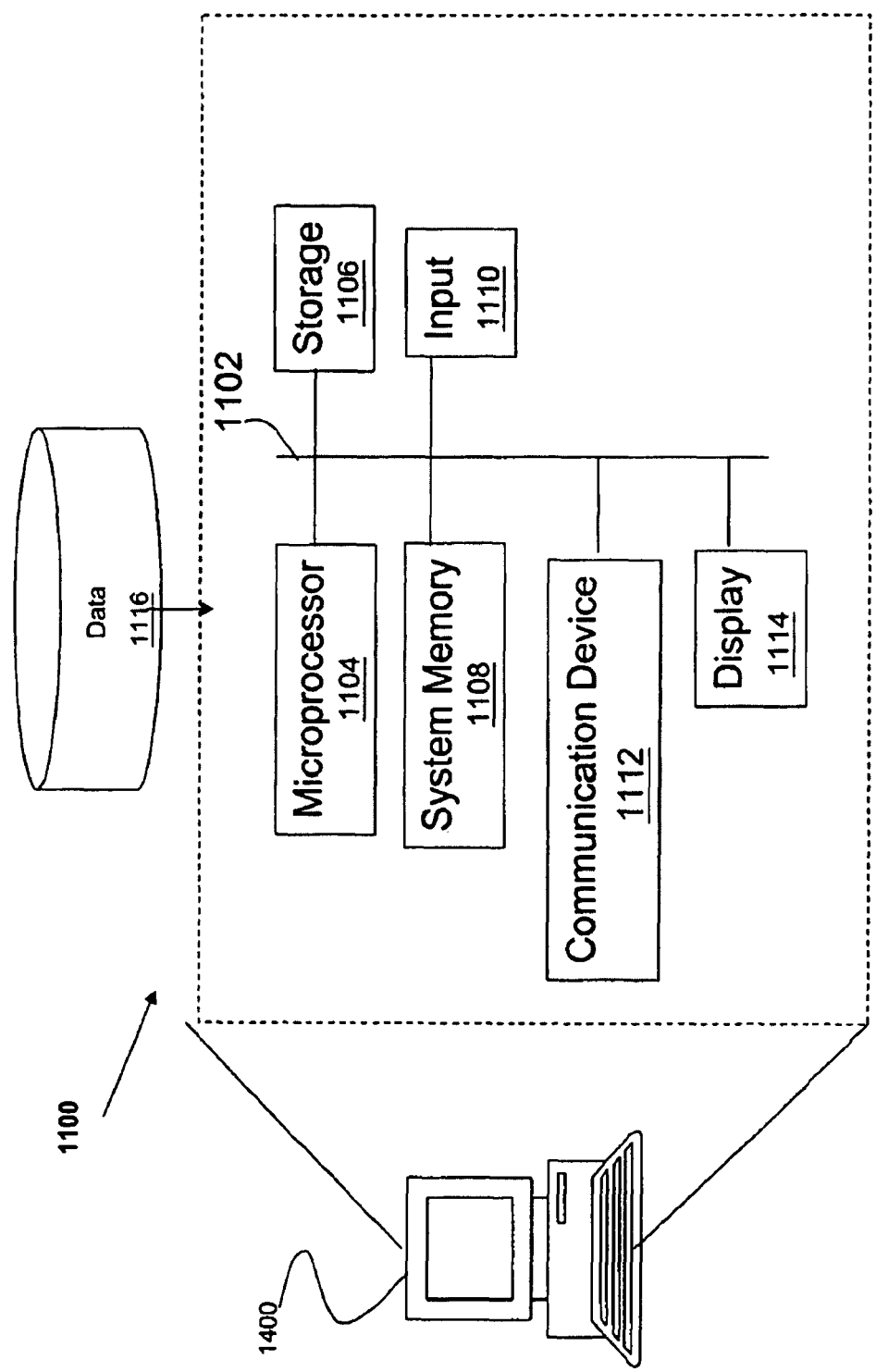
FIG. 11 illustrates a block diagram of an embodiment of a computer system used to implement a design flow.

One system for providing the disclosed embodiments is illustrated in FIG. 11. Illustrated is an embodiment of a computer system 1100 for implementing embodiments of the present disclosure including the systems and methods described herein. In an embodiment, the computer system 1100 includes functionality providing for one or more steps of designing a circuit or chip including performing simulations, verification analysis (e.g., DRC, LVS), extraction of parameters (e.g., LPE, RCX), layout, place and route, DFM, and/or other tools and procedures described above.

The computer system 1100 includes a microprocessor 1104, an input device 1110, a storage device 1106, a system memory 1108, a display 1114, and a communication device 1112 all interconnected by one or more buses 1102. The storage device 1106 may be a floppy drive, hard drive, CD-ROM, optical device or any other storage device. In addition, the storage device 1106 may be capable of receiving a floppy disk, CD-ROM, DVD-ROM, or any other form of computer-readable medium that may contain computer-executable instructions. The communications device 1112 may be a modem, a network card, or any other device to enable the computer system to communicate with other nodes. It is understood that any computer system 1100 could represent a plurality of interconnected computer systems such as, personal computers, mainframes, PDAs, and telephonic devices.

The computer system 1100 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 1108 may be configured to store a design database, library, technology files, design rules, PDKs, models, decks, and/or other information used in the design of a circuit and/or chip.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

A database 1116 may be any standard or proprietary database software known in the art. The physical location of the database 1116 is not limiting and may exist remotely from the server, be accessible by internet or intranet. The disclosure of the database 1116 includes embodiments that include a plurality of databases.

In summary, the aspects of the present disclosure provide a method and system for improved design of a circuit and chip to be fabricated using an optical shrink technology node process. In this way, circuits and/or chip can, efficiently, be decreased in size and/or increased in performance. Moreover, the methodology provides for a reduced human-intervention into the design process decreasing the risk of errors.

In an embodiment, the methods and systems described herein may benefit a foundry supplier in providing service to a designer. For example, scaling factors may be embedded in deliverables for an optical shrink technology node (e.g., extraction tools, simulation tools). For example, a shrink factor may be embedded in an LPE technology file, RC technology file, and/or simulation model (SPICE model) provided by the foundry to a customer (e.g., designer).

In one embodiment, the present disclosure provides a method of designing a circuit. The method includes providing a first set of design data associated with a design. The first set of design data is in a first technology node. The simulating the design using a model including an embedded scaling factor. A layout is generated from the simulated design. The layout may be in the first technology node dimension. The layout is used generate a second set of design data. The second set of data is in a second technology node. The second technology node is an optical shrink of the first technology node. In an embodiment, the second set of data includes a pattern to be formed on a photomask.

The present disclosure also provides a method of designing a circuit including providing a layout of a design. The layout is in a first technology node. A parameter is extracted from the layout in the first technology node using a layout parameter extraction (LPE) tool having an embedded scaling factor. The extracted parameter is associated with the layout in a second technology node.

The present disclosure also provides another embodiment of a method of designing a circuit. A layout of a design is provided. The layout is in a first technology node. A parameter is extracted from the layout using a technology file having an embedded scaling factor. The extracted parameter is associated with the layout in a second technology node. In an embodiment, the extraction uses an RC extraction technology file. In an embodiment, the second technology node is an optical shrink of the first technology node.

In addition to the methods discussed below, similar embodiments including systems and computer readable mediums are provided that include embedded scaling factors, for example, in a simulation mode, an extraction technology file, and/or a LPE tool (e.g., LPE deck).

Figure 12:
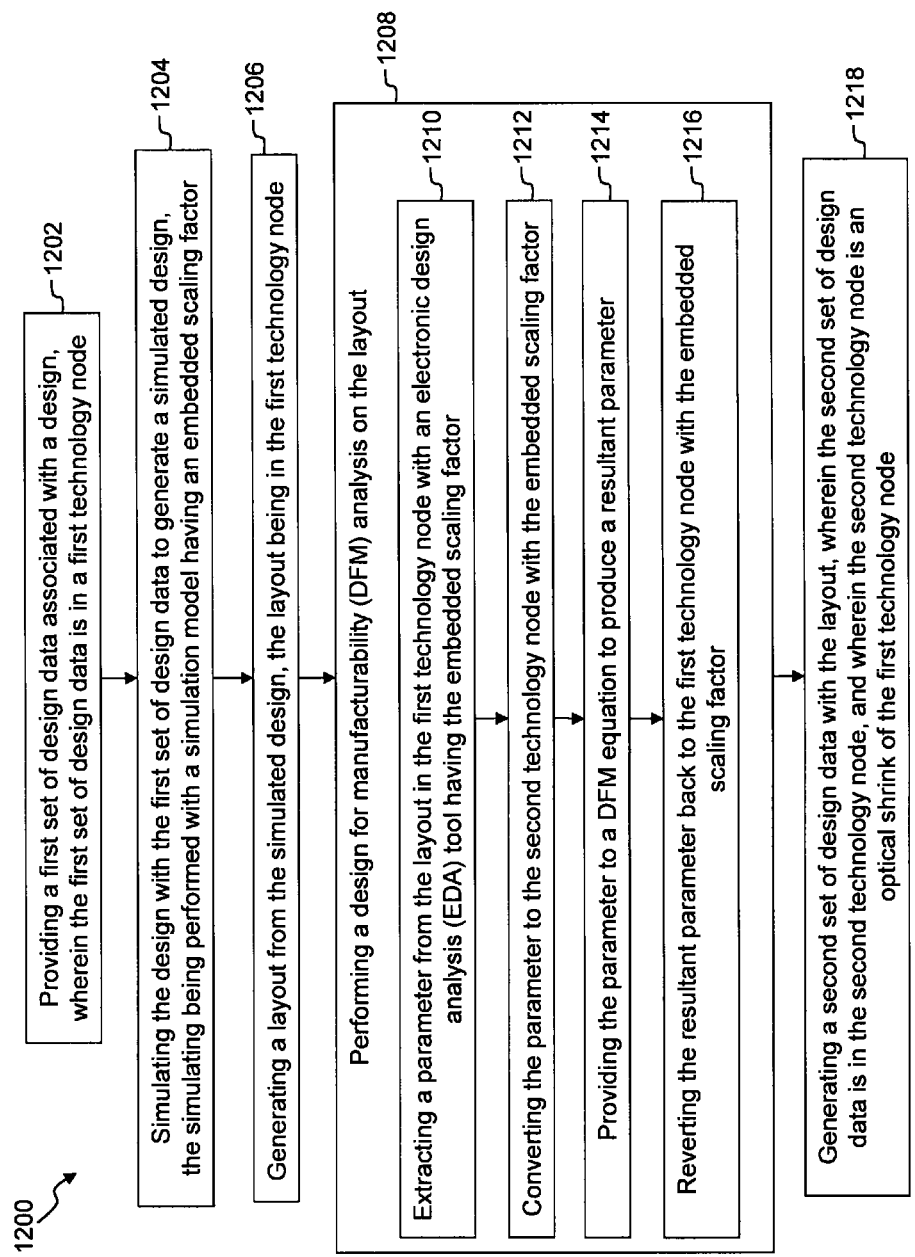
FIG. 12 illustrates a flow chart of a method of designing a circuit according to an embodiment of the present disclosure.

Referring now to FIG. 12, according to an embodiment of the present disclosure, a method 1200 of designing a circuit is described. The method 1200 begins at block 1202 by providing a first set of design data associated with a design, wherein the first set of design data is in a first technology node. The method 1200 continues to block 1204 by simulating the design with the first set of design data to generate a simulated design, the simulating being performed with a simulation model having an embedded scaling factor. The method 1200 then continues to block 1206 by generating a layout from the simulated design, the layout being in the first technology node. The method 1200 next continues to block 1208 by performing a design for manufacturability (DFM) analysis on the layout. The DFM analysis includes extracting a parameter from the layout in the first technology node with an electronic design analysis (EDA) tool having the embedded scaling factor, as shown in block 1210, converting the parameter to the second technology node with the embedded scaling factor, as shown in block 1212, providing the parameter to a DFM equation to produce a resultant parameter, as shown in block 1214, and reverting the resultant parameter back to the first technology node with the embedded scaling factor, as shown in block 1216. The method 1200 finishes at block 1218 by generating a second set of design data with the layout, wherein the second set of design data is in the second technology node, and wherein the second technology node is an optical shrink of the first technology node.

Figure 13:
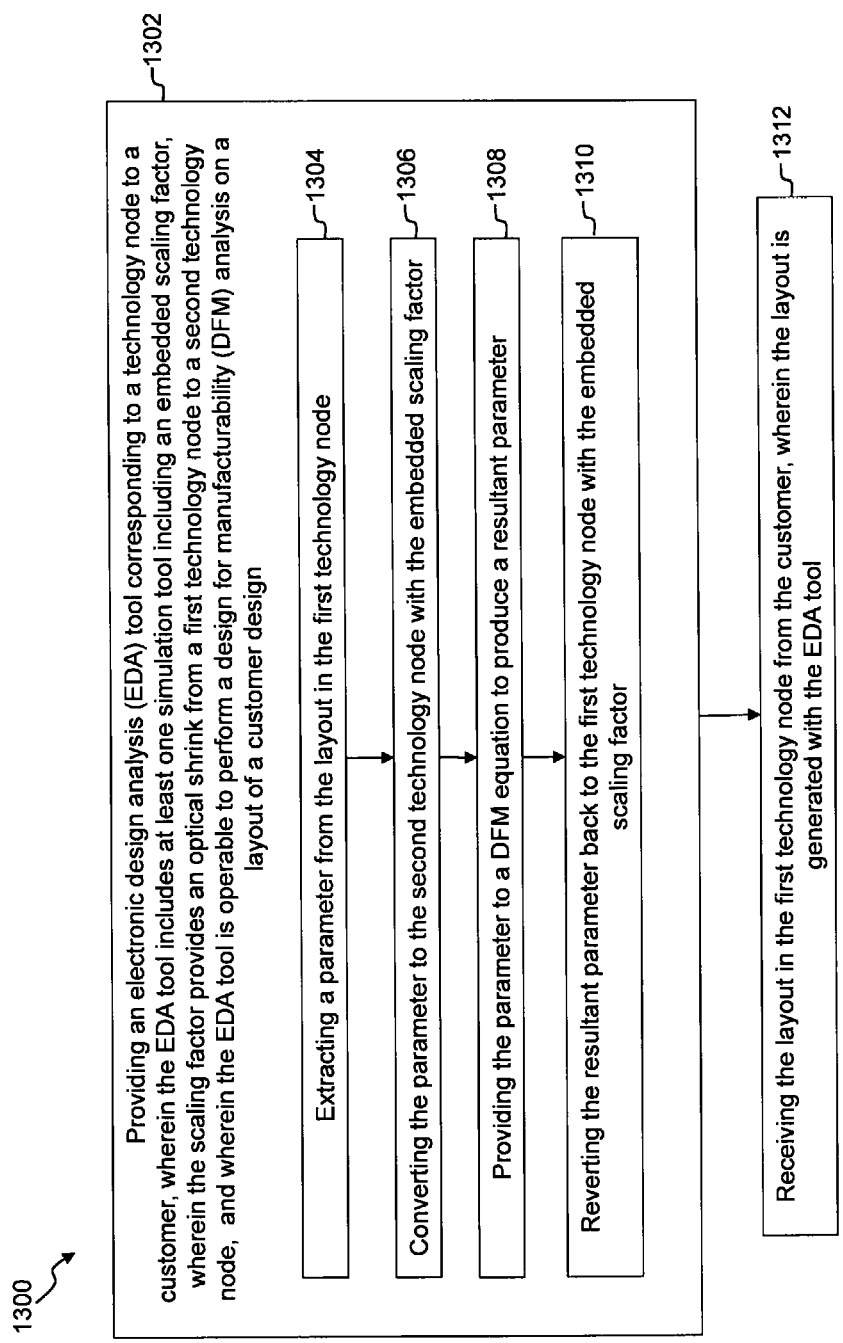
FIG. 13 illustrates a flow chart of a method for manufacturing a semiconductor integrated circuit according to another embodiment of the present disclosure.

Referring now to FIG. 13, according to another embodiment of the present disclosure, a method 1300 for manufacturing a semiconductor integrated circuit is described. The method 1300 begins at block 1302 by providing an electronic design analysis (EDA) tool corresponding to a technology node to a customer, wherein the EDA tool includes at least one simulation tool including an embedded scaling factor, wherein the scaling factor provides an optical shrink from a first technology node to a second technology node, and wherein the EDA tool is operable to perform a design for manufacturability (DFM) analysis on a layout of a customer design. The DFM analysis includes extracting a parameter from the layout in the first technology node, as shown in block 1304, converting the parameter to the second technology node with the embedded scaling factor, as shown in block 1306, providing the parameter to a DFM equation to produce a resultant parameter, as shown in block 1308, and reverting the resultant parameter back to the first technology node with the embedded scaling factor, as shown in block 1310. The method 1300 finishes at block 1312 by receiving the layout in the first technology node from the customer, wherein the layout is generated with the EDA tool.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims.

What is claimed is:

1. A method of designing a circuit, comprising:
  providing a first set of design data associated with a design, wherein the first set of design data is in a first technology node;
  simulating the design with the first set of design data to generate a simulated design, the simulating being performed with a simulation model having an embedded scaling factor;
  generating a layout from the simulated design, the layout being in the first technology node;
  performing a design for manufacturability (DFM) analysis on the layout, wherein the DFM analysis includes:
    extracting a parameter from the layout in the first technology node with an electronic design analysis (EDA) tool having the embedded scaling factor;
    converting the parameter to the second technology node with the embedded scaling factor;
    providing the parameter to a DFM equation to produce a resultant parameter; and
    reverting the resultant parameter back to the first technology node with the embedded scaling factor; and
  generating a second set of design data with the layout, wherein the second set of design data is in the second technology node, and wherein the second technology node is an optical shrink of the first technology node.

2. The method of claim 1, wherein the generating the second set of design data includes generating a pattern to be formed on a photomask.

3. The method of claim 1, wherein providing the first set of design data includes providing a netlist.

4. The method of claim 1, wherein the simulating is performed with a SPICE model.

5. The method of claim 1,
  wherein the providing includes providing a first set of design data in a first technology node of 45 nm; and
  wherein the generating the second set of design data includes generating the second set of design data in a second technology node of 40 nm.

6. The method of claim 1, further comprising:
  fabricating a device including the design using a process associated with the second technology node.

7. The method of claim 1, wherein the simulating is performed with a simulation model having an embedded scaling factor of 0.9.

8. A method of designing a circuit, comprising:
  providing a layout of a design, wherein the layout is in a first technology node; and
  extracting a plurality of parameters from the layout in the first technology node using an electronic design analysis (EDA) tool having an embedded scaling factor, the plurality of parameters including both scalable parameters and non-scalable parameters;
  performing a design for manufacturability (DFM) analysis on the layout, wherein the DFM analysis includes:
    determining whether each parameter in the plurality of parameters is a scalable or non-scalable parameter;
    multiplying the scalable parameters by the embedded scaling factor to convert the scalable parameters to the second technology node;
    providing the scalable parameters and non-scalable parameters to a DFM equation system to produce resultant scalable parameters and resultant non-scalable parameters; and
    dividing the resultant scalable parameters by the embedded scaling factor to revert the resultant scalable parameters back to the first technology node.

9. The method of claim 8,
  wherein the multiplying includes converting the scalable parameters to the second technology node that is a 0.9 optical shrink from the first technology node; and wherein the multiplying is performed with an embedded scaling factor of 0.9.

10. The method of claim 8, wherein the extracting is performed with an LPE deck.

11. The method of claim 8, wherein the extracting is performed with an EDA tool that is a tool selected from the group consisting of: a SPICE simulation, an LPE tool, an RC extraction tool, an electromigration or IR-drop analysis tool, a power analysis tool, a timing analysis tool, a noise analysis tool, and combinations thereof.

12. The method of claim 8, further including, after performing the DFM analysis on the layout, extracting one of a resistance and a capacitance of an interconnect included in the layout.

13. The method of claim 8, further comprising:
translating the layout in the first technology node to design data in the second technology node, wherein the design data provides a pattern to be fabricated on a substrate.

14. A method for manufacturing a semiconductor integrated circuit, comprising:
providing an electronic design analysis (EDA) tool corresponding to a technology node to a customer, wherein the EDA tool includes at least one simulation tool including an embedded scaling factor, wherein the scaling factor provides an optical shrink from a first technology node to a second technology node, and wherein the EDA tool is operable to perform a design for manufacturability (DFM) analysis on a layout of a customer design, the DFM analysis including:
extracting a parameter from the layout in the first technology node;
converting the parameter to the second technology node with the embedded scaling factor;
providing the parameter to a DFM equation to produce a resultant parameter; and
reverting the resultant parameter back to the first technology node with the embedded scaling factor; and
receiving the layout in the first technology node from the customer, wherein the layout is generated with the EDA tool.

15. The method of claim 14, wherein the providing the electronic design analysis tool includes providing a simulation tool that includes at least one of a SPICE simulation, an LPE simulation and an RC extraction tool.

16. The method of claim 14, wherein the providing the electronic design analysis tool includes providing a simulation tool including an embedded scaling factor of 0.9.

* * * * *